United States Patent
Bösch et al.

(12) 
(10) Patent No.: US 6,249,183 B1
(45) Date of Patent: Jun. 19, 2001

(54) HIGH-EFFICIENCY AMPLIFYING DEVICE

(75) Inventors: Wolfgang Bösch, Ulm; Felix Anton Petz, Haus im Wald, both of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/254,841

(22) PCT Filed: Sep. 9, 1997

(86) PCT No.: PCT/EP97/04917

§ 371 Date: Jan. 24, 2000

§ 102(e) Date: Jan. 24, 2000

(87) PCT Pub. No.: WO98/11664

PCT Pub. Date: Mar. 19, 1998

(30) Foreign Application Priority Data

Sep. 14, 1996 (DE) .............................................. 196 37 582

(51) Int. Cl.[7] .................................................. H03G 7/00
(52) U.S. Cl. ............................................. 330/126; 330/14
(58) Field of Search .............................. 330/53, 126, 302, 330/303; 333/14

(56) References Cited

U.S. PATENT DOCUMENTS

| 3,755,754 | 8/1973 | Putz | 330/149 X |
| 4,376,916 | * 3/1983 | Glaberson | 333/14 X |
| 4,450,417 | * 5/1984 | Folkmann | 330/126 X |
| 5,510,752 | * 4/1996 | Gagon | 330/126 |

FOREIGN PATENT DOCUMENTS

| 196 37 582 | 3/1997 | (DE) . |
| 0 047 825 | 3/1982 | (EP) . |
| 0 252 364 | 1/1988 | (EP) . |
| 0 255 652 | 2/1988 | (EP) . |
| 0 330 774 | 9/1989 | (EP) . |
| 2 158 625 | 11/1985 | (GB) . |
| 5110357 | * 4/1993 | (JP) | 330/126 |
| 063338728A | 12/1994 | (JP) . |

* cited by examiner

*Primary Examiner*—Steven J. Mottola
(74) *Attorney, Agent, or Firm*—Venable; Norman N. Kunitz

(57) ABSTRACT

Disclosed is a high-efficiency amplifying device wherein a control signal for a power-amplifying unit is produced from an input signal in a pre-amplification stage, resulting in a reduced disturbance output signal with a constant efficiency in the amplifying device.

4 Claims, 1 Drawing Sheet

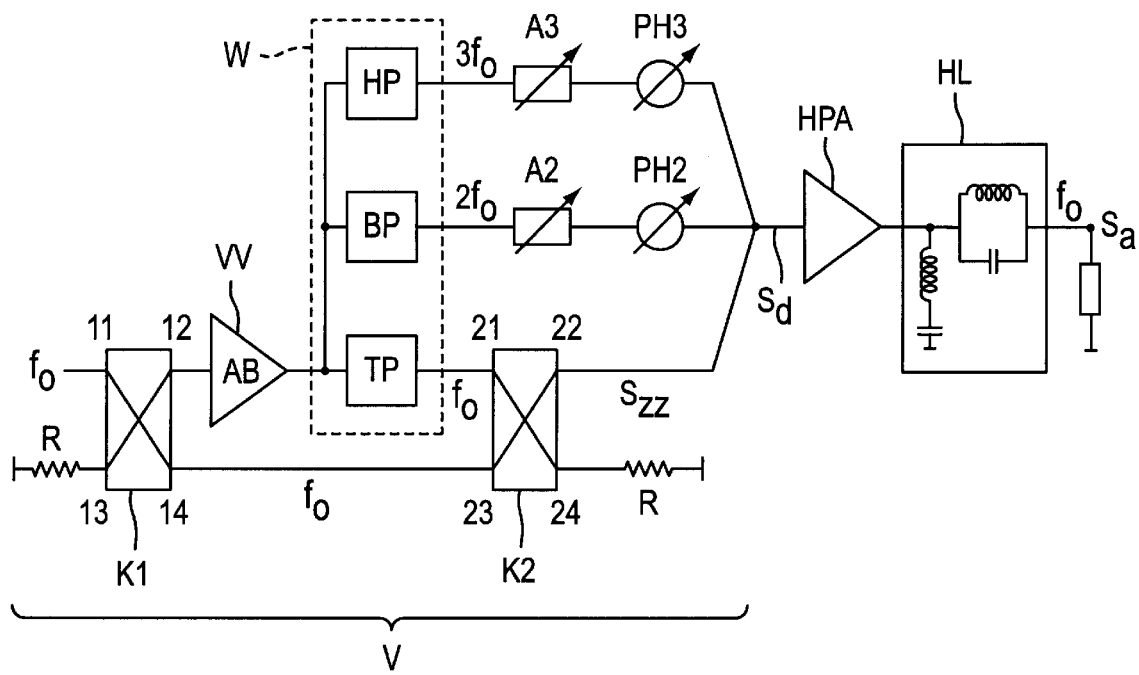
FIG. 1
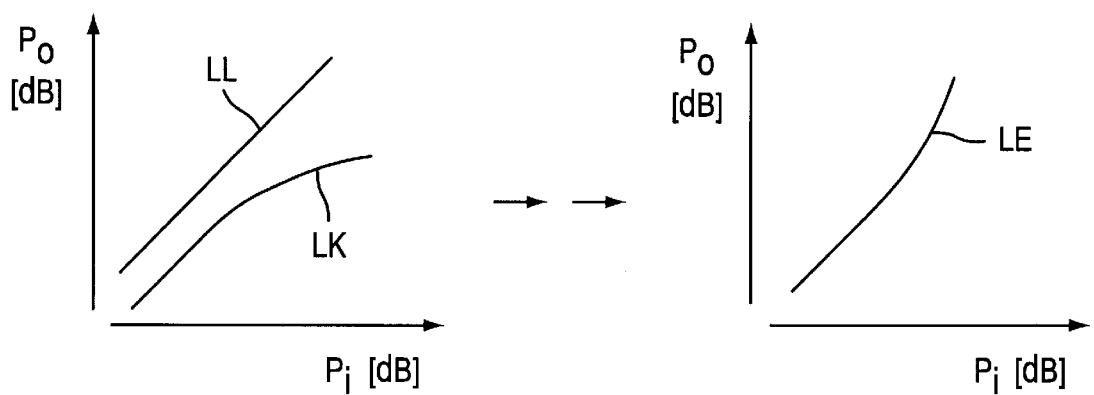
FIG. 2A
FIG. 2B

HIGH-EFFICIENCY AMPLIFYING DEVICE

BACKGROUND OF THE INVENTION

The invention relates to a high-efficiency amplifying device.

High-efficiency amplifying devices as such have been known for some time, particularly if they are embodied as so-called class F amplifiers, e.g. see also "Solid State Radio Engineering" by Kraus and Bastian, John Wiley and Sons, New York, Section 14-4 Class F Amplification. It is essential for amplifiers with class F operation that resonance devices for a basic frequency and at least one harmonic be connected on the output side. As a rule, only twice or three times the basic frequency is used as a harmonic (e.g., RF Design, May 1996, pp 79–84: "An Introduction to class F Power Amplifiers" by F. H. Raab).

High-efficiency amplifying devices are of particular interest for accumulatoroperated or battery-operated devices with high frequencies, such as mobile telephones, so as to allow for long operating times with the limited energy supply.

A high-efficiency amplifying device for the 8-GHz band is described in the IEEE MTT-S Digest 1996, pp 689–692. For this device, a trapeze-shaped half-wave signal is generated in a pre-amplification stage, located in front of the power amplifying unit, from a sine-shaped input signal as a drive signal for the power amplifying unit, meaning a field-effect transistor. The $3^{rd}$ and the $5^{th}$ harmonic, 3fo and 5fo, are used in addition to the basic frequency in order to generate the trapezoid shape. In the report "High Efficiency Harmonic Control Amplifier" by Ingruber, Pritzel and Magerl, delivered during the IEEE MTT-S Intern. Symposium on Microwaves 1996, an amplifying device is described in which signal shares are generated in a preselection stage during the $2^{nd}$ harmonic in addition to the basic frequency from the input signal. These signal shares are used for the drive signal to achieve an approximately half-wave shape for the drive signal.

Arrangements with harmonics in the drive signal of the power amplifying unit have the advantage that a high degree of efficiency is achieved without over-modulating the power amplifier.

The disadvantage of devices with harmonics in the drive signal of the power amplifying unit is the appearance of intermodulation products in the output signal, resulting from generated harmonics. The intermodulation products in the basic frequency cannot be suppressed by the basic-frequency band-pass filter on the output side.

U.S. Pat. No. -A-3,755,754 discloses a high-efficiency amplifying device, in which a drive signal for an active power amplifying unit is derived in a preselection stage from an input signal, in such a way that the drive signal contains signal shares for the basic frequency of the input signal and the at least one harmonic of this basic frequency, wherein the amplification characteristic of the preselection stage has an inverse phasefrequency characteristic to the power amplifier for the basic frequency.

A high efficiency amplifying device is also known from EP-A 0 252 364 where the amplification characteristic of the preselection stage has a signal-expanding course for the signal share in the basic frequency.

It is the object of the present invention to provide a high-efficiency amplifying device, which supplies good signal amplification with low disturbance and high linearity while requiring little expenditure.

SUMMARY OF THE INVENTION

The above object generally is achieved according to the present invention by a high-efficiency amplifying device, in which a drive signal for an active power amplifying unit is derived in a preselection stage from an input signal, such that the drive signal comprises signal shares with the basic frequency of the input signal and at least one harmonic of this basic frequency, and wherein the amplification characteristic of the preselection stage has a signal-expanding course for the signal share of the basic frequency and/or has an inverse phase-frequency characteristic to the power amplifying device for the basic frequency, and the signal share of the at least one harmonic is frequency selectively coupled out of the preamplification element output signal and is combined once more with the signal share of the basic frequency with an expanding amplification characteristic. Advantageous embodiments and modifications of the invention are disclosed and claimed.

The amplifying device according to the invention permits the operation of the active power amplifying unit in a non-linear characteristic range that is advantageous for the total degree of effectiveness. It also keeps the signal distortions low by compensating for the most part the intermodulation products generated around the basic frequency through the opposing phase influence of the signal-expanding characteristic of the preselection stage and/or the inverse phase-frequency characteristic.

The signal-expanding characteristic preferably is realized through forming the difference between an intermediate signal, generated based on a signal-compressing characteristic, and a non-distorted input signal. The signal shares for the at least one harmonic are preferably derived from the signal mixture, which develops in the preselection stage as a result of the non-linear characteristic.

In special cases, the linearity of the power amplifier can be improved through injection of the $2^{nd}$ and $3^{rd}$ harmonic.

The invention is illustrated in further detail below with the aid of exemplary embodiments and by referring to the Figures.

BRIEF DESCRIPTION OF THE DRAWING

FIG. 1 is a preferred embodiment of an arrangement according to the invention.

FIGS. 2a–2b shows a variety of amplification characteristics.

DETAILED DESCRIPTION OF THE PREFERRED EMBODIMENT

The sketched arrangement comprises a power amplification stage HPA, of the type known per se, with a harmonic load HL connected at the output. The harmonic load HL in particular contains resonant circuits for the basic frequency and at least one harmonic thereof. The circuit components for the direct current supply are not drawn in for reasons of clarity. Designs for the direct-current circuit and the harmonic load are generally known from prior art.

A preselection stage V generates a drive signal $S_d$ for the power amplifying unit HPA from a high-frequency input signal $S_i$. The preselection stage comprises a coupler arrangement with two 3 dB couplers K1, K2. The first coupler K1 divides the input signal $S_i$ that is present at its one input 11 into two parallel outputs 12, 14. Of the two outputs (14), one is connected directly to a first input 23 of the second coupler K2. The other output 12 of the first coupler is connected to the input of a pre-amplifier VV. The pre-amplifier has a non-linear, signal-compressing amplification characteristic and is preferably operated in the B or AB mode. In addition to the signal shares of the basic frequency fo, the output signal of the pre-amplifier VV also contains signal shares for harmonics of this basic frequency and intermodulation product and is supplied via a lowpass filter TP to the other input 21 of the coupler K2.

The coupler K2 combines the signals present at its inputs 21, 23, in such a way that a signal $S_{22}$ appears at its one output 22. For the basic frequency fo, this signal corresponds to a signal subtraction of the pre-amplification output signal $S_{21}$ from the signal $S_{23}$ at the coupler input 23, which is directly proportional to the input signal $S_i$. The signal subtraction is achieved through phase opposition of the basic frequency signal shares when the signals are combined, e.g. by using two 90° couplers for K1 and K2. If the coupler K2 is a narrow-band coupler, then the low-pass filter TP can be omitted. The connections 13 of the first coupler and 24 of the second coupler, which are not needed, are terminated non-reflecting with the impedances R.

The output signal $S_{22}$ of the second coupler K2 has a signal-expanding course LE with respect to the input signal $S_i$, which is plotted in FIG. 2B as output power $P_o$ above the input power $P_i$. Such a characteristic course is achieved advantageously by generating a signal with signal-compressing characteristic course LK in the pre-amplifier VV and by subtracting this signal from a more powerful signal with linear characteristic course LL (FIG. 2A). Thus, in the arrangement shown in FIG. 1, the signal present at input 21 of the second amplifier has less power than the signal at the other input 23 of this coupler, meaning the pre-amplifying stage is adjusted to a signal amplification of less than one (<O dB). The same considerations, meaning the use of a signal-expanding course for compensating a signal-compressing power stage, also apply to a non-linear (inverse) phase-frequency characteristic via the output power for the basic frequency. The sketched arrangement has the advantage of a simple design in which the signal-compressing amplification characteristic is realized, for example, with a single-stage transistor amplifier while signal shares for the harmonics of the basic frequencies occur simultaneously as a result of the non-linearity of the characteristic.

Shares are filtered out frequency selective from the output signal of pre-amplifier VV for one or several harmonics of the basic frequency, particularly the second harmonic 2 fo and/or the third harmonic 3 fo, e.g. by means of an additional coupler or a frequency-dividing network W with a low-pass filter TP for shares of the basic frequency fo, a band-pass filter BP for shares of the $2^{nd}$ harmonic 2 fo and an additional band-pass filter or a high-pass filter HP for shares of the $3^{rd}$ harmonic 3 fo. These shares are then again added to the signal share of the basic frequency in the output signal $S_{22}$ of the second coupler K2 in order to generate the drive signal $S_d$ for the power amplifying unit PA. In order to optimize the signal form of the drive signal, amplitude adjustment elements A2, A3 and/or phase adjustment elements PH3, PH2 can be inserted into the signal lines for the signal shares of the basic frequency on the one hand and the harmonic on the other hand.

In addition to or as an alternative to the reduction in intermodulation products with high linearity in the output signal for the power amplifying device, resulting from the expanding characteristic of the drive signal, a reduction in intermodulation products and an improvement in linearity is possible by impressing a specific phase-frequency characteristic onto the drive signal, that is to say the inverse of the phase-frequency characteristic for the power amplifier stage. It is easy and advantageous to generate such an inverse phase-frequency characteristic with the same arrangement as shown in the drawing, provided the pre-amplifier VV and the power amplifier HPA have the same phase-frequency characteristic. This is the case, in particular, if the two amplifiers are technically identical. However, additional phase elements can also be provided to generate a specific phase-frequency characteristic.

The invention is not limited to the previously described examples, but can also be realized in different embodiments within the scope of knowledge of a person skilled in the art. In particular, more complex switching arrangements, comprising amplification and reduction elements, can be provided in both signal paths.

What is claimed is:

1. A high-efficiency amplifying device, in which a drive signal for an active power amplifying unit is derived in a preselection stage from an input signal, such that the drive signal comprises signal shares with the basic frequency of the input signal and at least one harmonic of this basic frequency, and wherein the amplification characteristic of the preselection stage has a signal-expanding course for the signal share of the basic frequency and/or has an inverse phase-frequency characteristic to the power amplifying device for the basic frequency, and the signal share of the at least one harmonic is frequency selectively coupled out of the pre-amplification element output signal and is combined once more with the signal share of the basic frequency with an expanding amplification characteristic.

2. A device according to claim 1, wherein the preselection stage has a pre-amplification element with a signal-compressing amplification characteristic, and the signal-expanding characteristic of the preselection stage is formed through a subtraction by combining the output signal from the pre-amplification element with a signal share having a linear dependence on the input signal.

3. A device according to claim 2, wherein the pre-amplification element is arranged in one of two signal paths between two 3 dB couplers.

4. A device according to claim 1, wherein for the at least one harmonic, the harmonic for double the basic frequency is selected.

* * * * *